(12) United States Patent
Mendenhall (10) Patent No.: US 7,061,740 B2
(45) Date of Patent: Jun. 13, 2006

(54) SYSTEM AND METHOD FOR PROTECTING AN AUDIO AMPLIFIER OUTPUT STAGE POWER TRANSISTOR

(75) Inventor: Eric Mendenhall, Dove Canyon, CA (US)

(73) Assignee: Gibson Guitar Corp., Nashville, TN (US)

( * ) Notice: Subject to any disclaimer, the term of this patent is extended or adjusted under 35 U.S.C. 154(b) by 403 days.

(21) Appl. No.: 10/606,530

(22) Filed: Jun. 26, 2003

(65) Prior Publication Data

US 2004/0109276 A1 Jun. 10, 2004

Related U.S. Application Data

(60) Provisional application No. 60/391,650, filed on Jun. 26, 2002.

(51) Int. Cl.
H02H 3/08 (2006.01)
H02H 9/02 (2006.01)

(52) U.S. Cl. .............. 361/93.1; 361/101; 361/103; 327/143; 326/112

(58) Field of Classification Search ........... 361/93.1
See application file for complete search history.

(56) References Cited

U.S. PATENT DOCUMENTS

| | | | | |
|---|---|---|---|---|
| 3,781,839 A | * | 12/1973 | Bodge | 340/595 |
| 3,979,745 A | * | 9/1976 | Bishop | 341/140 |
| 4,021,701 A | | 5/1977 | Davies | 361/18 |
| 4,243,946 A | | 1/1981 | Wang | 330/265 |
| 4,330,809 A | | 5/1982 | Stanley | 361/103 |
| 4,471,323 A | | 9/1984 | Trilling | 330/268 |
| 4,611,180 A | | 9/1986 | Stanley | 330/298 |
| 4,644,288 A | | 2/1987 | Stanley | 330/2 |
| 5,734,261 A | * | 3/1998 | Knudsen | 323/276 |
| 6,039,471 A | * | 3/2000 | Wyland | 374/43 |

OTHER PUBLICATIONS

"Function Fitting" Mendenhall (1976) *Nonlinear Circuits Handbook* (Daniel H. Sheingold, Ed.) Analog Devices, Inc., Norwood, MA.

"Computer Aided Design and Analysis of Class B and Class H Power Amplifier Output Stages", Eric Mendenhall (1996) *Audio Engineering Society Preprint*, 101st Convention Nov. 8-11, 1996, Los Angeles, California.

* cited by examiner

*Primary Examiner*—Phuong T. Vu
*Assistant Examiner*—Terrence Willoughby
(74) *Attorney, Agent, or Firm*—Waddey & Patterson, P.C.; Lucian Wayne Beavers (57) ABSTRACT

A system and method for protecting an output transistor in an audio amplifier output stage includes a protection circuit that protects the output transistor from excessive currents and voltages, and does not interfere with the normal operation of the output transistor. The protection circuit generates an estimate of the power dissipated by the output transistor, applies this estimate to an electrical analog of the thermal time constants of the transistor to obtain an estimate of the temperature differential between junction and case, compares this differential to a limit, which is a function of transistor case temperature.

23 Claims, 10 Drawing Sheets

SYSTEM AND METHOD FOR PROTECTING AN AUDIO AMPLIFIER OUTPUT STAGE POWER TRANSISTOR

This application is a Non-Provisional Utility application that claims benefit of co-pending U.S. Patent Application, Ser. No. 60/391,650 filed Jun. 26, 2002, entitled "Audio Power Amplifier Output Stage Protection" which is hereby incorporated by reference.

A portion of the disclosure of this patent document contains material that is subject to copyright protection. The copyright owner has no objection to the facsimile reproduction by anyone of the patent document or the patent disclosure, as it appears in the Patent and Trademark office patent file or records, but otherwise reserves all copyright rights whatsoever.

Be it known that I, Eric Mendenhall, a citizen of the United States, residing in Dove Canyon, Calif., have invented a new and useful "System And Method For Protecting An Audio Amplifier Output Stage Power Transistor."

BACKGROUND OF THE INVENTION

The present invention relates generally to audio power amplifiers. More particularly, this invention pertains to a system and method for protecting an audio amplifier output stage power transistor.

Audio amplifiers are well known in the art and, as the name suggests, are used to amplify audio signals. These amplifiers typically include an audio input, which is connected to some type of audio source, and an audio output, which is connected to audio speakers. These amplifiers receive audio signals from the audio source, amplify those signals, generate audio current signals based on those amplified signals, and output the current signals to the speakers. It is these current signals that drive the speakers and cause them to reproduce the audio signals that are generated by the audio source to create sound.

To generate the current signals necessary to drive the speakers, audio amplifiers typically include an output stage specifically designed for that purpose. The output stage usually includes a pair of power transistors that are coupled to one another and a power source, which provides power to the power transistors so they can generate the necessary output currents. Each power transistor supplies a predetermined portion of the required output current.

There are a variety of different types of audio amplifier output stages in the prior art. There are Class A output stages, which include power transistors that operate continuously, and Class B output stages, which include power transistors that operate only 50% of the time. There are also Class AB output stages, which include power transistors that operate somewhere between 50% of the time and continuously, and Class C output stages that include power transistors that operate less than 50% of the time.

The following discussion will focus specifically on Class B type audio amplifier output stages. It is noted, however, that Class A, Class AB, Class G, Class H, and other types of output stages known in the art, suffer from problems similar to the ones discussed below with regard to Class B output stages. As a result, the solution to the problems with Class B output stages presented in this application may be similarly applied to solve the problems associated with these other types of output stages as well.

Figure 1:
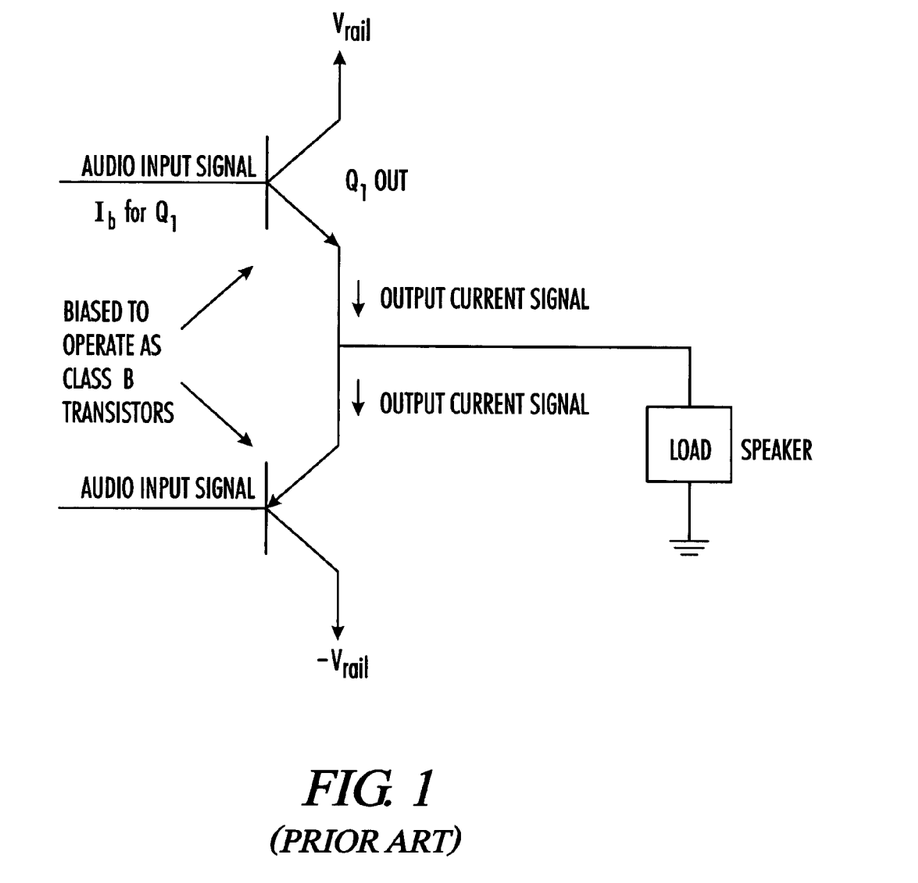
FIG. 1 is a block diagram of a typical Class B Audio Amplifier Output Stage.

Class B audio amplifier output stages typically include two bipolar power transistors directly coupled to one another and a power supply. The power supply is connected to the power transistors and supplies the transistors with the power necessary to generate the required output currents. A portion of a typical Class B audio amplifier output stage is shown in FIG. 1. In that figure, Q1out is a NPN bipolar power transistor, biased to operate as a Class B transistor, and Q2out is a PNP bipolar power transistor, also biased to operate as a Class B transistor. The power supply is shown as + and −Vrail. For convenience, other components that are included with these types of output stages are not shown in FIG. 1. In addition, the biasing circuits necessary to properly bias the transistors, which are well known in the art, are not shown in FIG. 1.

The power transistors used in the output stage of the audio amplifier shown in FIG. 1 can only be operated under certain conditions or they will fail. Power transistors such as these have specific bond wire limits, power dissipation limits, breakdown voltage limits, and second voltage breakdown limits. If any of these limits are exceeded, the power transistors can fail.

Figure 2:
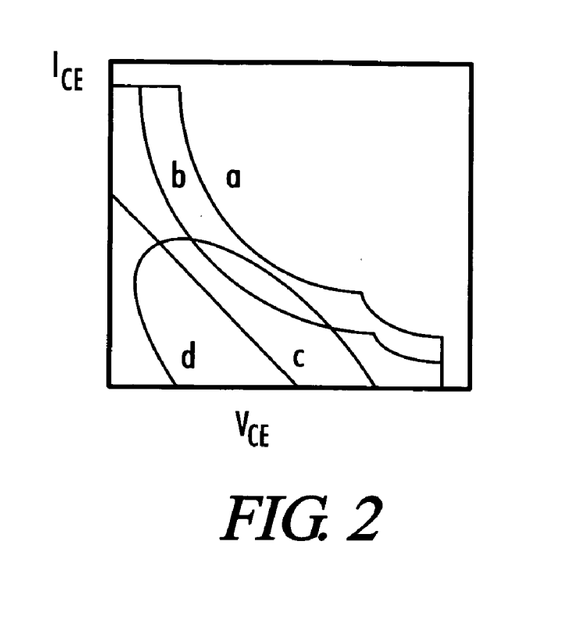
FIG. 2 is a plot showing a power transistor's steady state Safe Operating Area and load lines.

The combination of these limits generates something that is commonly referred to as a power transistor's Safe Operating Area, or SOA. As shown in FIG. 2, the SOA for a power transistor is generally defined in terms of the voltage across the transistor, Vce, and the current passing through the transistor, Ice. As long as the voltage across and the current passing through a power transistor stay within certain limits, the transistor will operate properly. If these parameters are exceeded for too long, however, the transistor will fail.

It is important to note that the above-referenced SOA defines the power transistor's steady state operating limits. As explained in detail in this application, these limits may be exceeded for limited time periods without damaging the power transistor. This is true for two reasons. First, power transistors typically fail because of excessive heating, which is, in turn, caused by excessive voltage and current. Second, power transistors have thermal impedance and, as a result, it takes a certain amount of time for the transistor to heat up to the point where it is damaged. This aspect of power transistor operation and the potential benefits associate with allowing the power transistor to temporarily exceed these limits are discussed in more detail below.

Looking at FIG. 2, the x-axis, or horizontal axis, is the voltage applied to the transistor, Vce, and the y-axis, or the vertical axis, is the current passing through the transistor, Ice. Line a, which corresponds to the steady state operation of a power transistor at 25 degrees Celsius, defines the SOA for the power transistor. The area beneath line a is the SOA and the area above the SOA is considered to be outside of the SOA. If the transistor is operated above the SOA for a predetermined time period, the transistor will fail.

Lines b also defines a SOA for the power transistor. Line b defines the SOA for the steady state operation of the power transistor at 100 degrees Celsius, Line c defines the load line when the power transistor is driving a resistive load, and Line d defines the load line when the power transistor is driving a reactive load. As before, the SOA is defined as the area beneath each line and the power transistor will fail if operated in the areas above the lines for too long.

A power transistor may operate outside of the SOA for many reasons. This typically occurs when one of the power transistor circuits develops a short circuit and causes the power transistors to deliver more current than they are rated to deliver. The power supplies used with power transistors are able to provide more current to a power transistor than it can handle without causing damage and, when a short circuit occurs, they do exactly that.

The prior art has addressed this problem using various different types of audio amplifier output stage protection circuits, or simply, protection circuits. The prior art includes simple current limiter protection circuits that limit the output current of a power transistor to a predetermined maximum value. An example of a prior art current limiter protection circuit is shown in FIG. 3 and a plot showing the protection threshold (line e) generated by that circuit is shown in FIG. 4.

The current limiter prevents the transistor from delivering too much current when a short circuit occurs and destroying itself. The operation of current limiter circuits is well known in the prior art. However, a brief explanation of the operation of these circuits is in order to understand the significance of the present invention.

Figure 3:
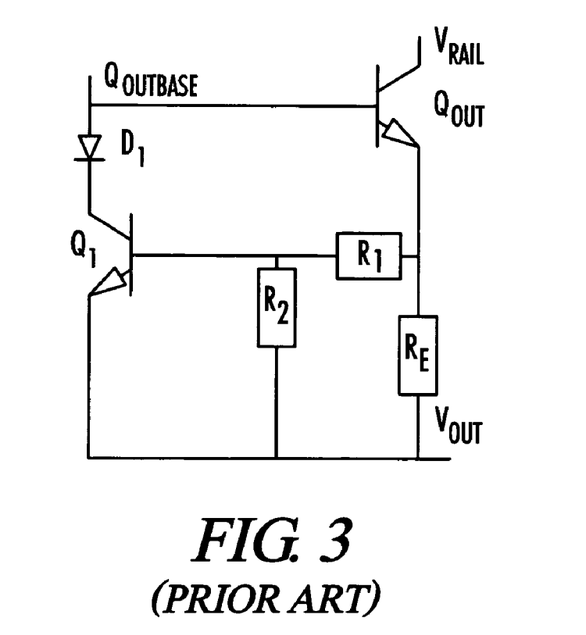
FIG. 3 is a block diagram showing a simple current limiter protection circuit.
Figure 4:
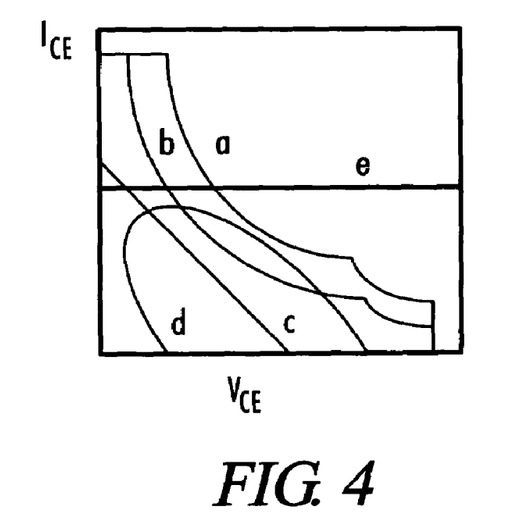
FIG. 4 is a plot showing a protection threshold generated by the simple current limiter shown in FIG. 3.

As shown in FIG. 3, prior art current limiters typically include a resistor network that is connected to the output of the power transistor and to a second transistor, which is, in turn, connected to the base of the power transistor. These circuits also typically include a diode that is connected between the second transistor and the power transistor base.

In FIG. 3, the power transistor is Qout, the resistor network includes RE, R1, and R2, the second transistor is Q1, and the diode is D1. Vout represents the voltage output of the power transistor and is connected to a speaker (not shown) or some other appropriate load. Vce is the voltage across Qout, Ice is the current flowing through Qout, Ib is the base current flowing into Qout, and Vbe is the emitter-base voltage for Q1. Also, the second power transistor that is typically included in an audio amplifier output stage is not shown in FIG. 3 in order to simplify this discussion.

RE is much smaller than both R1 and R2. The small resistance of RE, and the large resistance of R1 and R2, causes the majority of Ice to flow through RE to the speaker. Only a small amount of Ice is diverted to R1 and R2 and used to operate the protection circuit. The diode D1 prevents current from flowing back into the circuit that generates the base signal Ib.

The resistor network of RE, R1, and R2 is a voltage divider network. As a result, when voltage builds up on RE, proportional voltages build up on R1 and R2. When the voltage on R2 builds up to a predetermined level, Vbe for Q1, which in this case is approximately 0.6 to 0.7 volts, Q1 turns on and begins diverting base current Ib away from the base of Qout. This, in turn, prevents Ice for Qout from increasing any further.

Under normal operating conditions, only a small amount of voltage builds up on RE. This voltage is not sufficient to generate a voltage on R2 that will turn Q1 on. If a short circuit occurs, however, Ice will increase significantly and generate a large voltage on RE. This voltage is transferred through the voltage divider network to R2 and, when the voltage across R2 reaches 0.6 to 0.7 volts, Q1 turns on and prevents Ice from increasing further. Consequently, the power transistor is prevented from destroying itself by supplying a large output current.

While current limiter circuits do limit the amount of current output by power transistors, they also interfere with the normal operation of the very power transistors they are designed to protect. As mentioned previously, the protection threshold provided by a typical current limiter is shown in FIG. 4. Line e represents the protection limit provided by the current limiter and illustrates how the protection circuit prevents the transistor current, Ice, from exceeding a predetermined limit.

Unfortunately, the protection circuit also prevents the transistor from operating in portions of the SOAs associated with lines a and b. In other words, the current limiter prevents the power transistor from operating in areas where it can safety operate.

Figure 5:
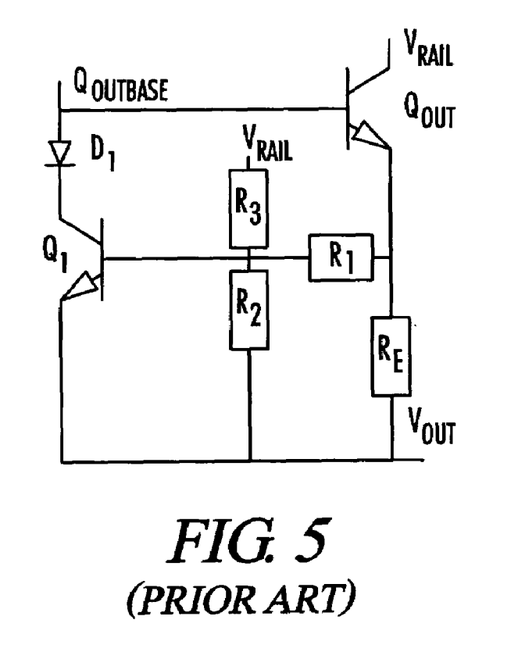
FIG. 5 is a block diagram showing a typical single slope voltage current limiter protection circuit.
Figure 6:
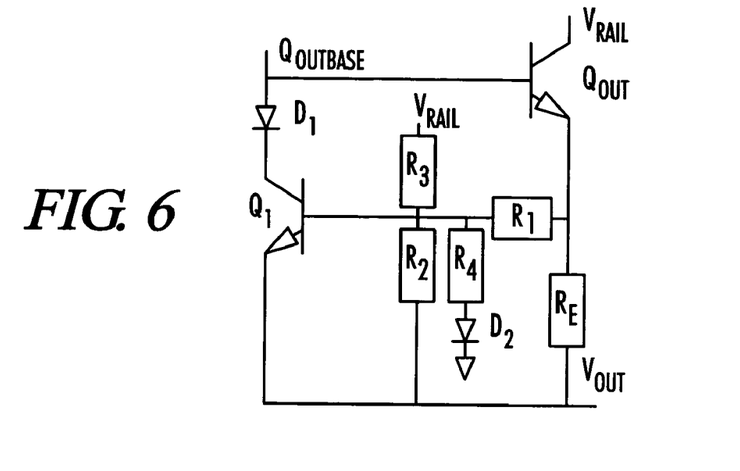
FIG. 6 is a block diagram showing a typical two-slope voltage current limiter protection circuit.
Figure 7:
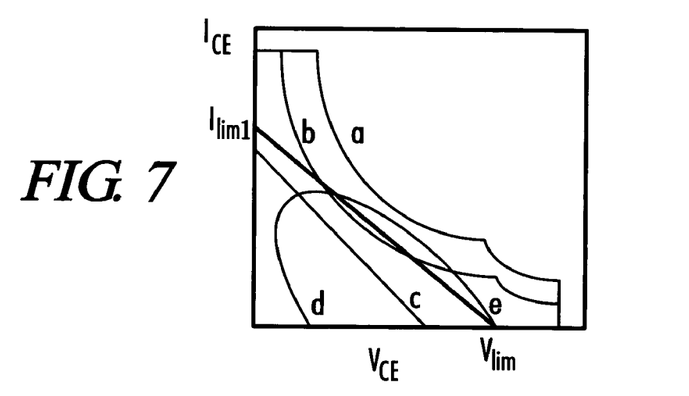
FIG. 7 is a plot showing a protection threshold generated by the single slope voltage current limiter shown in FIG. 5.
Figure 8:
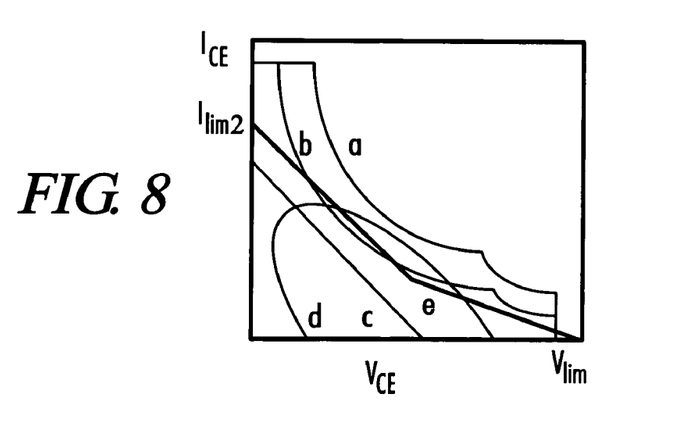
FIG. 8 is a plot showing a protection threshold generated by the two-slope voltage current limiter shown in FIG. 6.

The prior art also includes voltage-current limiter protection circuits, commonly referred to as VI limiters, which limit the output current and output voltage of a power transistor to predetermined maximum values. VI limiter protection circuits include single-slope VI limiters and two-slope VI limiters. Single slope VI limiters, as their named suggests, provide a protection threshold that forms a sloping straight line. In a similar manner, two slope VI limiters provide a protection threshold that forms a line having two different slopes. Examples of single slope and two slope VI limiters are shown in FIGS. 5 and 6, respectively. Plots showing examples of the protection thresholds (line e in each figure) generated by these types of circuits are shown in FIGS. 7 and 8, respectively.

VI limiters provide protection to the output stage by limiting the power transistor current, Ice, and the power transistor voltage, Vce. As shown in FIG. 7, this type of protection circuit generates a sloping protection threshold, line e, rather than the horizontal line (line e in FIG. 4) generated by the simple current limiter protection circuit.

A typical VI limiter protection circuit (FIG. 5) is very similar to the simple current limiter discussed previously. The only difference between the two types of circuits is the addition of a resister, R3, to the resister divider network. The resistor, R3, is connected to the power supply Vrail. R3 has a much larger resistance than R1 and R2, and RE has a resistance that is much smaller than R1, R2, and R3.

The operation of the VI limiter is also very similar to the simple current limiter protection circuit. With regard to the power transistor current, Ice, the circuits operate exactly the same. If Ice increases, a voltage is generated on RE and transferred onto R2. When the voltage on R2 reaches Vbe, Q1 turns on and begins diverting base current from Qout and prevents Ice from increasing further. The difference between the two circuits, however, relates to how the circuits respond to the voltage, Vce, developed across the power transistor.

The addition of the resister R3 modifies the voltage divider network so an additional voltage is generated across R2. The power supply voltage Vrail drops part of its voltage across R3 and part of its voltage across the parallel combination of R2 and R1 plus RE.

During normal operations, the voltage developed across R2 is insufficient to cause Q1 to turn on, i.e., the voltage across R2 is less than Vbe for Q1. When the power transistor voltage Vce increases, however, the voltage across R2 also increases. If Vce increases to a certain predetermined level, the voltage developed across R2 will reach Vbe for Q1 and Q1 will turn on. Once this happens, Q1 diverts base current Ib from Qout and prevents Vce from increasing further.

As was the case with the simple current limiter, the VI limiter circuit also interferes with the normal operation of the power transistors it is designed to protect. Referring back to FIG. 7, the VI limiter protection threshold is a sloping line, line e, that extends from Ilim1 to Vlim. A power transistor connected to this type of protection circuit cannot operate in the area above line e and this prevents the transistor from operating in a portion of its SOA. Once again, this type of operation is undesirable for the same reason as that discussed above for the simple current limiter.

As mentioned above, a typical two slope VI limiter protection circuit is shown in FIG. 6 and the typical protection threshold for that circuit (line e) is shown in FIG. 8. A review of this protection circuit indicates that it is very similar to the single slope VI limiter discussed previously.

The difference between the two circuits is the addition of a resistor R4 and a diode, D2, which is tied to ground, to the resistor voltage divider network. When Vce for Qout is less than or equal to Vrail, the diode D2 turns on and R4 becomes part of the voltage divider network. When Vce exceeds Vrail, D2 turns off and R4 is taken out of the network.

The use of R4 causes the slope of the protection threshold, line e, to change. This change in slope, in turn, causes Vlim to increase. The increase in Vlim, in turn, allows the power transistor to operate in more of its SOA. Although the two slope VI limiter protection circuit is an improvement over the single slope VI limiter and the simple current limiter, it still interferes with the normal operation of the power transistor it is designed to protect.

While all of the prior art protection circuits discussed above do protect the power transistor when properly used, they also unnecessarily interfere with the normal operation of the power transistor. This occurs for a number of reasons. As seen in FIG. 2, the operating characteristics of a power transistor vary nonlinearly in response to changes in the power transistor voltage and current. The protection thresholds generated by the prior art protection circuits, however, vary linearly. As a result, the protection thresholds do not accurately track the operating characteristics of the power transistor and prevent the power transistor from operating in areas it normally would be able to operate. This characteristic of a simple current limiting protection circuit can be seen in FIG. 4, which shows the protection threshold, line e, limiting the power transistor output current so that the power transistor cannot operate in areas that are clearly below lines a, b, c, and d and, therefore, within the normal operating ranges of the power transistor. Similar limiting characteristics of single slope and two slope VI limiters can be seen in FIGS. 7 and 8.

The operating characteristics of a power transistor also vary in response to the operating temperature of the power transistor. As the temperature increases, the operating limits decrease. As the temperature decreases, the operating limits increase. Protection thresholds generated by prior art protection circuits do not vary with the power transistor temperature. Thus, prior art protection circuits interfere with the normal operation of power transistors for this reason as well. This characteristic of a power transistor can clearly be seen in FIGS. 4, 7, and 8, which each show the operating characteristics of a power transistor at 25 degrees Celsius, line a, having higher operating limits than the operating characteristics of the power transistor at 100 degrees Celsius, line b. The failure of the protection thresholds generated by the prior art protection circuits to vary with temperature is also shown in these figures.

Regardless of the reason, the interference with normal power transistor operation is an undesirable condition. The purpose of the power transistor is to generate an output current that is representative of the audio input signal and that is capable of driving a speaker so that it reproduces the sounds associated with the audio input signal. When the prior art protection circuits limit a power transistor as discussed above, the power transistor can no longer generate an output current that is representative of the audio input signal and, as a result, the speaker no longer accurately reproduces the sounds associated with the audio input signal.

A solution to the problems presented by these prior art protection circuits is taught in U.S. Pat. No. 4,330,809, issued to Stanley on May 18, 1982 and entitled "Thermal Protection Circuit For The Die Of A Transistor." The '809 patent teaches a protection circuit for an audio amplifier output stage power transistor that generates a protection threshold that more accurately tracks the output capabilities of a power transistor. In other words, the circuit provides protection when necessary without interfering with the normal operation of the power transistor.

Stanley accomplishes this task by using a protection circuit that generates a signal that is representative of the power applied to a power transistor, transforms this signal into a signal that is representative of a temperature differential between the power transistor die and heat sink, senses the temperature of the power transistor heat sink, and combines the temperature differential signal with the sensed heat sink signal to generate a signal representative of the temperature of the power transistor die. The power transistor die is the portion of a power transistor that can be damaged by excessive heat and cause the power transistor to fail. The Stanley protection circuit uses the die temperature signal, in conjunction with a control circuit, to reduce the power dissipation of the power transistor if a predetermined die temperature is exceeded.

The protection circuit taught in the '809 patent, however, is a complex circuit and can be difficult to implement in practice. As shown in FIG. 2 of the '809 patent, the protection circuit requires several different types of circuit components in order to operate properly, including a differential pair of matched transistors, which form a multiplier, two operational amplifier circuits, an RC feedback network, and a temperature sensor for sensing the temperature of the heat sink used with the power transistor. As a result, this protection is undesirable in some applications.

What is needed, then, is a system and method for protecting an audio amplifier output stage that is less complex and easier to implement than the protection circuit disclosed in the '809 patent and that protects a power transistor without interfering with the normal operation of that transistor.

SUMMARY OF THE INVENTION

Accordingly, one object of the present invention is to provide a system and method of protecting an audio amplifier output stage power transistor that does not interfere with the normal operation of that transistor.

Another object of the present invention is to provide a system and method for generating a protection threshold for a power transistor that tracks the operating characteristics of that transistor more accurately than prior art protection circuits.

A third object of the present invention is to provide a system and method for generating a protection threshold for a power transistor that varies with the operating temperature of the power transistor.

Still another object is to provide a system and method for generating a protection threshold for a power transistor that allows the power transistor to temporarily exceed its steady state operating limits.

Yet another object of the present invention is to provide a system and method of protecting an audio amplifier output stage power transistor that is less complex and easier to implement than the protection circuit taught by the '809 patent.

These objects, and other objects that will become apparent to one skilled in the art upon a review of the following description, are satisfied by the present invention of a system and method for protecting an audio amplifier output stage power transistor. The system includes a transistor power estimation circuit, a power estimate filtering circuit, a transistor control circuit, a transistor temperature adjustment circuit, and a transistor maximum current limiting circuit. The transistor power estimation circuit generates an estimate of the power dissipation of the power transistor. The filtering circuit filters the power estimate generated by the transistor power estimation circuit so that a transient power estimate does not trigger the transistor control circuit. The transistor control circuit compares the filtered power estimate to a predetermined transistor power limit and, when the filtered power estimate exceeds the power limit, generates a transistor control signal that cause the power transistor to modify its power dissipation so that it no longer exceeds the predetermined power limit. The transistor temperature adjustment circuit varies the power estimate generated by the transistor power estimation circuit and the control signal generated by the transistor control circuit so that they vary as a function of the power transistor temperature. The transistor maximum current limiting circuit limits the current output of the power transistor to a predetermined maximum current level.

The transistor power estimation circuit may include a variety of different types of transistor power estimation circuits. The power estimation circuit may be a single slope power estimation circuit or a multi-slope power estimation circuit. In addition, the power estimation circuit may be replaced by a simple current limiting circuit. As explained in detail below, however, the multi-slope power estimation circuit is the preferred form of the power estimation circuit.

The transistor control circuit controls the power transistor output by modifying the power transistor output current, voltage, or both. The transistor temperature adjustment circuit may be integrated into the transistor power estimation circuit in some embodiments. The transistor maximum current limiting circuit may not be included in embodiments where the transistor power estimation circuit is not a multi-slope type of transistor power estimation circuit.

The method includes the steps of generating an estimate of the power dissipated by the transistor, applying this estimate to a circuit that emulates the thermal transient response of the transistor, comparing the filtered power estimate to a transistor power limit that is a dynamic function of the case temperature, and generating a transistor control signal that causes the power transistor to modify and reduce its current output when the filtered power estimate exceeds the power limit.

Inherent in the method discussed above, is a new method of calculating the junction temperature of a power transistor. More specifically, the steps of generating the estimate of the power dissipation by the power transistor, the varying of that estimate as a function of the power transistor temperature, and the filtering of that time varying estimate generates a signal that is representative of the junction temperature of the power transistor. Significantly, the junction temperature signal is calculated without using a multiplier, which reduces the complexity of the circuit required to generate the signal.

DESCRIPTION OF THE PREFERRED EMBODIMENTS

Figure 9:
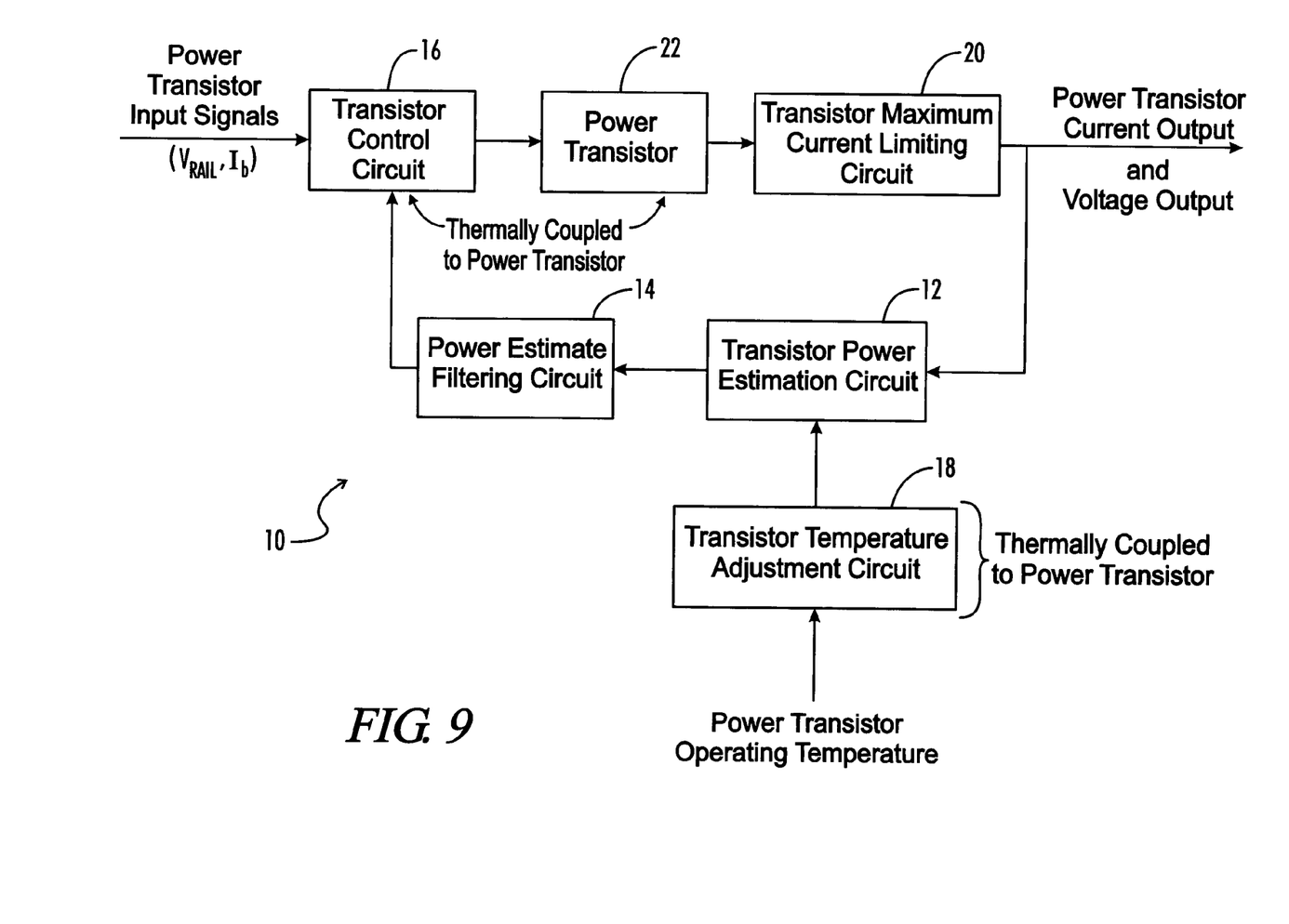
FIG. 9 is a block diagram showing one embodiment of the protection circuit of the present invention.

Referring to FIG. 9, one embodiment of the protection circuit 10 of the present invention includes a transistor power estimation circuit 12, a power estimate filtering circuit 14, a transistor control circuit 16, a transistor temperature adjustment circuit 18, and a transistor maximum current limiting circuit 20. The protection circuit 10 protects the audio amplifier output stage power transistor 22 by sensing the operating power of transistor 22 and modifying its input signals so that the operating power does not exceed a predetermined operating power limit.

Figure 10:
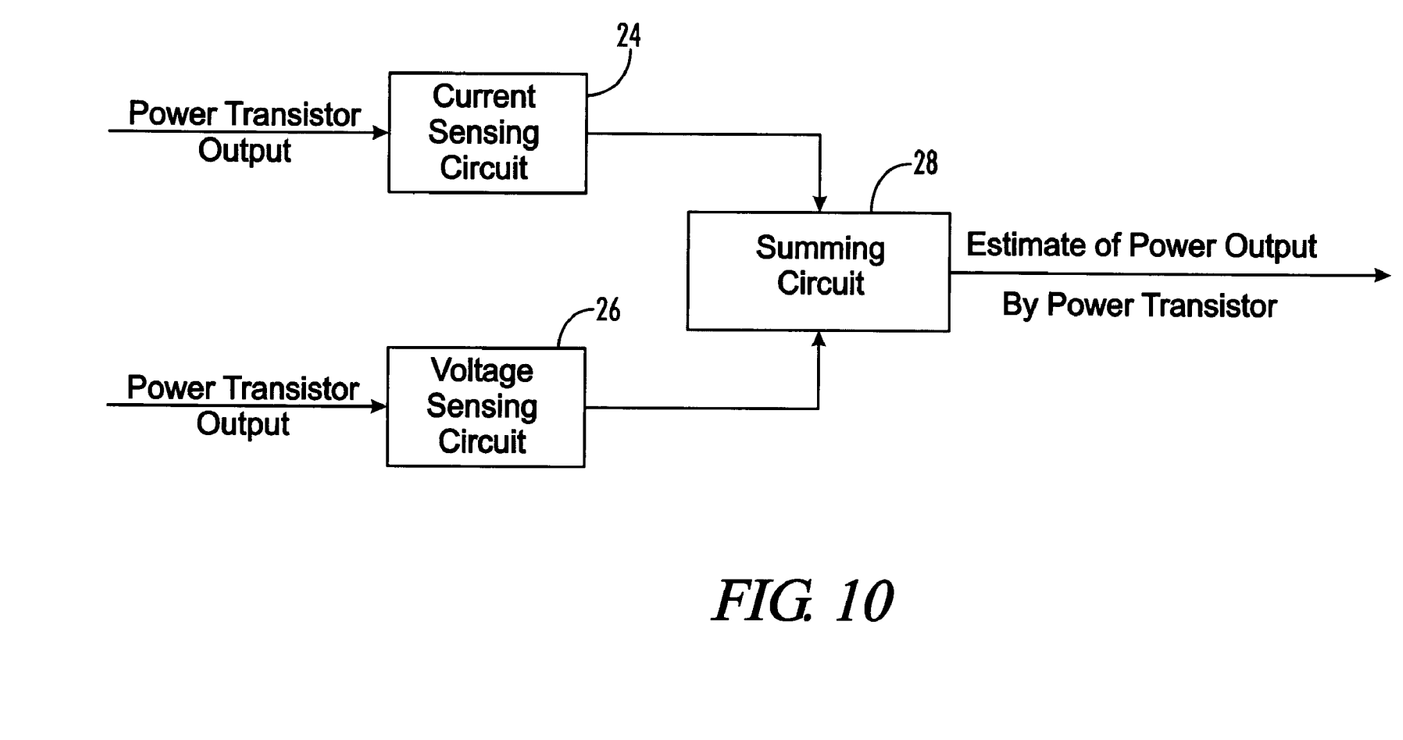
FIG. 10 is a block diagram showing one embodiment of the transistor power estimation circuit of the present invention.

Referring to FIG. 10, the transistor power estimation circuit 12 generates an estimate of the power dissipation of transistor 22. To accomplish this function, the circuit 12 includes a power transistor current sensing circuit 24, a power transistor voltage sensing circuit 26, and a summing circuit 28. Both circuits, 24 and 26, are connected to the output of the power transistor 22 and to the summing circuit 28. The current sensing circuit 24 generates a current signal that is representative of the current output of the transistor 22 and the voltage sensing circuit 26 generates a voltage signal that is representative of the voltage across the transistor 22.

The summing circuit 28 adds the current and voltage signals together to generate an estimate of the power dissipation of the transistor 22.

The power estimation circuit 12 may be a single slope power estimation circuit, which is a circuit that generates a power estimate that is a sloping straight line, or a two-slope power estimation circuit, which generates a power estimate that includes a straight line having two different sloping portions. One skilled in the art will recognize that resistor network used with the prior art single slope VI limiter discussed previously generates a power estimate that is a sloping straight line and, accordingly, that resistor network may be used as the power estimation circuit 12. Similarly, the resistor diode network used in the prior art two-slope VI limiter generates a power estimate that is a straight line having two different sloping portions. As a result, this resistor network may also be used as the power estimation circuit 12.

Figure 11:
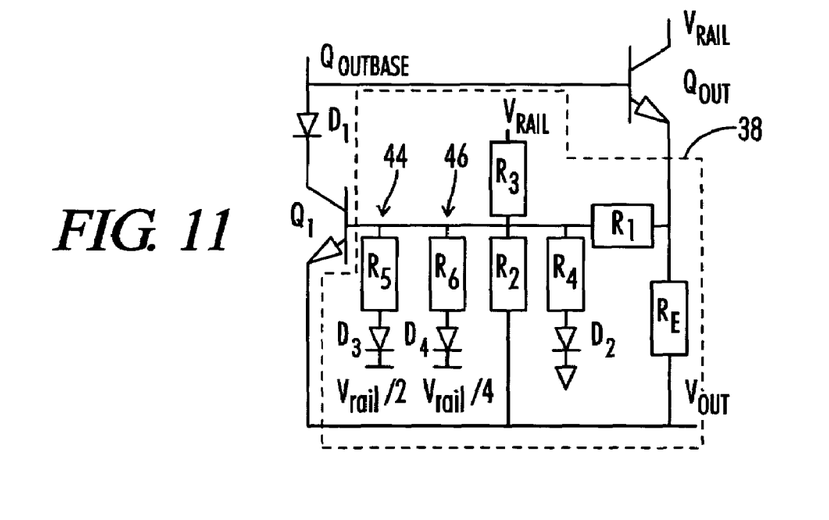
FIG. 11 is a schematic drawing showing one embodiment of the four-slope power estimation circuit of the present invention.

The preferred embodiment of the estimation circuit 12, however, is a novel four-slope power estimation circuit 38 developed by the applicant and shown in FIG. 11. As shown in that figure, the four-slope power estimation circuit 38 includes a resistor diode network that is similar to the resistor diode network used with prior art two-slope VI limiters. The novel power estimation circuit 38 includes a power transistor current sensing resistor network that includes resistors Re, R1, and R2, and a power transistor voltage sensing resistor diode network that includes resistors, R3 and R4, and diode D2. Similar circuits are used in the prior art two-slope VI limiter resistor diode network.

The resistor diode network used in the four-slope power estimation circuit 38 does include several components that are not included in prior art resistor diode networks. The novel resistor diode network includes two additional resistor diode pairs, 44 and 46, that are not included in prior art two-slope VI limiters. In addition, each resistor diode pair is connected to a reference voltage that falls between ground and the main power transistor rail voltages. Vrail/2 in one case and Vrail/4 in the other, both of which may already be available in Class G or H designs. The resistor diode pair in prior art two-slope VI limiters is connected to ground.

Figure 12:
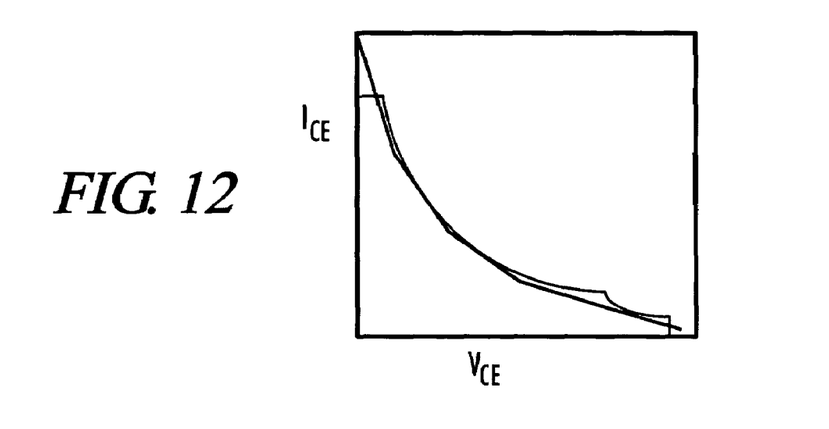
FIG. 12 is a plot showing a protection threshold generated by the four-slope voltage current limiter of the present invention.

The applicant recognized that by modifying a prior art two-slope VI limiter in the manner indicated above, a power estimation circuit could be created that, when properly optimized to do so, would generate a protection threshold that more accurately tracked the operating characteristics of a power transistor. In other words, a power estimation circuit could be created that generates a protection characteristic that can be optimized to simulate the operating characteristics of a power transistor accurately. As shown in FIG. 12, the four slope power estimation circuit of the present invention generates a protection threshold that is a piecewise linear approximation of the operating characteristics of a power transistor that is more accurate than the single slope or two-slope approximations taught by the prior art. The piecewise linear approximation includes three breakpoints that occur when the voltage output of the power transistor, Vout, is equal to or greater than, ground, Vrail/2, and Vrail/4. The breakpoints are generated by the resistor diode pairs used in the estimation circuit 38. The area beneath D2's breakpoint, Vrail, is fit with a single slope, while the area above it makes better use of the additional breakpoints.

Importantly, the piecewise linear approximation protection threshold generated by the novel four-slope power estimation circuit is very similar to the protection threshold generated by a much more complex multiplier circuit like the one used in the Stanley patent discussed previously. In other words, the novel four-slope power estimation circuit generates an estimate of the power dissipation of a power transistor that is very close to the actual power dissipation as measured by a multiplier circuit. This is significant because the novel four-slope power estimation circuit achieves this improvement by using a relatively simple two-slope VI limiter resister diode network and two additional resistors and diodes.

The novel four-slope power estimation circuit also can be used to tailor the protection threshold in the second breakdown region of a power transistor, where the allowable device dissipation is less than that determined by the thermally limited region. A multiplier circuit cannot be used to provide this tailoring process. A least-squares method could be used to determine the optimum curve fitting, but a graphical approach is sufficient for most purposes.

In alternate embodiments, the novel four-slope power estimation circuit 38 may be varied in several ways. The reference voltages for the resistor diode pairs may be set anywhere between ground and the main rail voltages to ensure that the protection threshold accurately tracks the operating characteristics of a power transistor. The power estimation circuit 12 may generate a protection threshold that includes more than four different slopes in order to create an even more accurate approximation. This could be accomplished by adding additional resistor diode pairs to the novel four-slope power estimation circuit.

In addition to the four-slope power estimation circuit 38, the protection circuit shown in FIG. 11 also includes one of the power transistors, Qout, typically found in an audio amplifier output stage and one embodiment of the transistor control circuit 16. In this embodiment, the transistor control circuit 16 includes a control transistor, Q1, and a control diode D1. The resistor R2 is connected in parallel with Vbe for Q1 and, when the voltage developed on Q1 reaches Vbe, Q1 turns on and diverts base current, Ib, from the power transistor, Qout. In this manner, the transistor Qout is prevented from destroying itself by supplying too much current and overheating.

For purpose of clarity with regard to the discussion of the four-slope power estimation circuit 38, FIG. 11 does not include the power estimate filtering circuit 14, the transistor temperature adjustment circuit 18, or the transistor maximum current limiting circuit 20. All of these missing circuits, however, could be included in the circuit shown in FIG. 11.

The values of the various resistors shown in FIG. 11 are calculated in the following manner. First, the protection threshold generated by the simple current limiter portion of circuit 38, Re, R1, and R2, is calculated as $$Ice = (Vbe/Re)(R1+R2)/R2. \tag{1}$$

It is noted that this portion of circuit 38, although very simple, cannot be optimized to adequately protect the output power transistor and, at the same time, preserve the normal operation of the associated audio amplifier.

Next, the protection threshold generated by single slope limiter portion of circuit 38, Re, R1, R2, and R3 is calculated in Equation 2 as:

$$Ice = [Vbe - (Vce/R3)((R1\ R2)/(R1+R2))][(R1+R2)/(R2\ Re)]. \tag{2}$$

Equation 2 is derived by superposition and several simplifying assumptions. R3 is assumed to be large with respect to R1 and R2, and Re is assumed to be small with respect to R1, R2, and R3. Further, Vrail is assumed to be large when compared to the saturation voltage of the power transistor, Qout, and the voltage across the emitter resistor, Re. It should also be noted that the single slope limiter portion of circuit 38 typically can be used when high voltage transistors are used with lower voltage rails. Under these conditions, the second breakdown limits of the power transistor will not come into play.

Moving on, R2 is chosen to be a value that will scale all of the rest of the resistors. Next, the Y intercept of the protection threshold (Vce=0, Ice=Ilim1) is calculated by setting Vce=0 in Equation 2 and solving for R1. This yields Equation 3 below:

$$R1 = R2[(Ilim1\ Re) - Vbe]/Vbe. \quad (3)$$

At this point, Vout is equal (ideally) to Vrail and there is no current flow in R3, so the equivalent circuit is the same as the simple current limiter shown in FIG. 2, i.e., the simple current limiter portion of circuit 38 in FIG. 11.

Continuing, R3 is determined by the X intercept of the protection threshold (Vce=Vlim1, Ice=0). Here, there is no voltage across Re, and R1 is in parallel with R2. Setting Ice=0 in Equation 2 and solving for R3 yields:

$$R3 = [Vlim1(R1\ R2)]/[Vbe(R1+R2)]. \quad (4)$$

Next, the protection threshold for the two-slope limiter circuit portion of circuit 38 is calculated in two parts. For Vce>Vrail, $$Ice = [Vbe - (Vce/R3)((R1\ R2)/(R1+R2))][(R1+R2)/(R2\ Re)]. \quad (5)$$

For Vce<Vrail:

$$Ice = [Vbe(R1+R2)/(R2\ Re)] + [((Vrail-Vce)R1)/(R4\ Re)] - [(Vce\ R1)/(R3\ Re)]. \quad (6)$$

Figure 13:
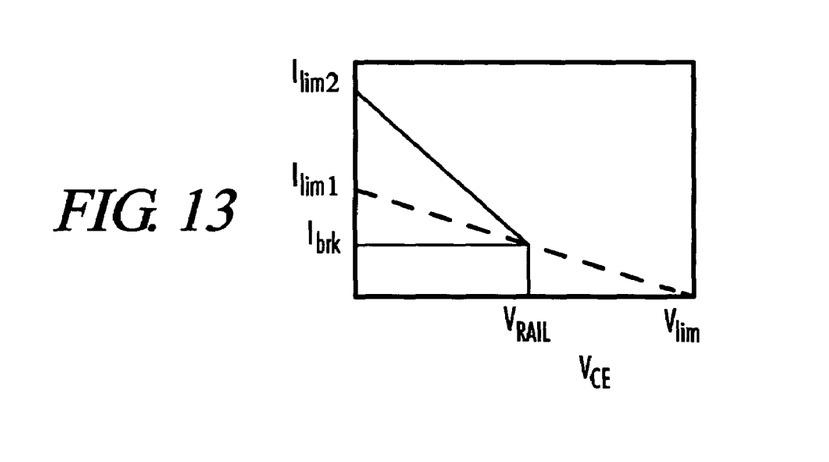
FIG. 13 is a plot showing protection threshold generated by a two-slope voltage current limiter.

This portion of circuit 38 matches the protection limits more closely to the actual power transistor capability. This circuit portion is analyzed in two parts, first with D2 off, then with D2 on. With D2 off, the circuit degenerates to the single slope limiter circuit portion of circuit 38. The diode will come into play when the output voltage is above ground, that is, when Vce is less than or equal to Vrail. FIG. 13 shows the two lines, where the single slope limit of Ilim1 is used for analysis, but is overtaken by the new limit Ilim2 after the breakpoint.

The next step in the design procedure begins with the single slope equivalent circuit, but instead of choosing Ilim1 as before, Ibrk is used as a starting point. The equation for the dashed line in FIG. 13 is $$Ice = [(-Ilim1/Vlin1)Vce] + Ilim1. \quad (7)$$

Solving for Ilim1 by setting Vce=Vrail and Ice=Ibrk yields:

$$Ilim1 = (Ibrk\ Vlim1)/(Vlim1 - Vrail). \quad (8)$$

After choosing Ibrk, Ilim1 can be calculated and the single slope design method, as indicated above, can be used to calculate R1, R2, and R3.

R4 is determined next. The only point to determine is the Y intercept (Vce=0, Ice=Ilim2). Setting Vce=0 in Equation 6 and solving for R4 yields:

$$R4 = (Vrail\ R1\ R2)/[(Ilim2ReR2) - (Vbe(R1+R2)). \quad (9)$$

The design procedure for the remaining resistors, R5 and R6, is very similar to the design procedure discussed above for R4 and will not be discussed in detail.

Referring back to FIG. 9, the power estimate filtering circuit 14 is operable to prevent transient power estimates, causing by transient peaks in the power transistor output voltage and current, from triggering the transistor control circuit 16. As initially discussed in the background section of this application, the Safe Operating Area (SOA) of a power transistor typically includes steady state limits. Since most of the SOA is thermally limited, the steady state SOA may be exceeded on a transient basis as long as the average power does not exceed the SOA limits. This is due to the transient thermal impedance of the power transistor itself acting as a capacitance in the electrical analog shown in FIG. 14, modeled with a single resister capacitor (RC) network. One skilled in the art will recognize that multiple time constants can be applied to create a more accurate model.

Since most transistors used in high power audio amplifiers have a transient thermal impedance response curve with a 10–90% rise time on the order of 200 ms, and most audio amplifiers have a corner frequency around 20 Hz (25 ms half cycles), the total thermal impedance from junction to case can, justifiably, be treated as an effective averaging circuit, i.e., a filtering circuit. As a result, the SOA of power transistors in a Class B amplifier design having a typical 50% duty cycle can be exceeded by a factor of 2 in the thermally limited region.

By including a thermal equivalent RC network, the protection circuit 10 can be designed to allow transients to pass while leaving the steady state limits intact. The capacitances should be chosen to match the output power transistor's transient thermal impedance 10–90% rise time. One skilled in the art will note that this equivalent circuit is a simple approximation of a complex system.

Figure 18:
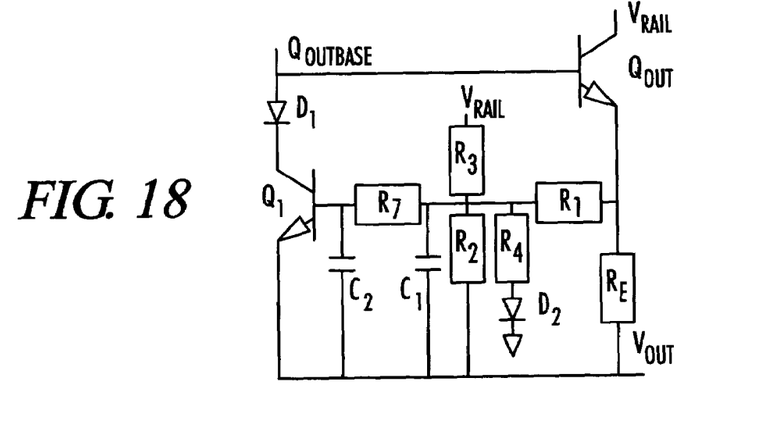
FIG. 18 is a block diagram showing one embodiment of the thermal equivalent RC network, or power estimate filtering circuit, of the present invention.

One embodiment of a thermal equivalent RC network, or power estimate filtering circuit is shown in FIG. 18 and includes two capacitors, C1 and C2, and a resister R7. In alternative embodiments, C2 could be placed in a Miller configuration. In this case, the time constants would vary with beta. Other configurations could allow a smaller time constant in the second breakdown region of the power transistor.

Figure 14:
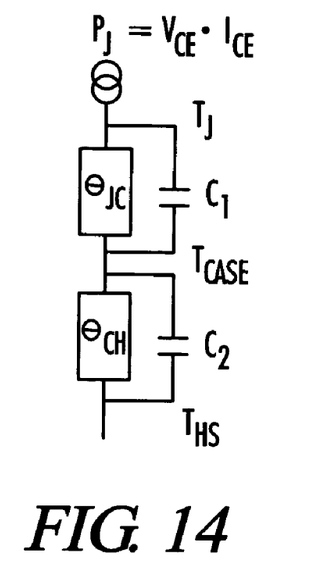
FIG. 14 is a schematic drawing showing a thermal-electrical analog for a power transistor.

One skilled in the art will recognize that the circuit shown in FIG. 18 is behaving as an analog of the power device shown in FIG. 14. Instead of computing instantaneous dissipation with a true multiplier, the circuit generates a two slope piecewise linear summing approximation. The use of a linear multiplier with a thermal analog RC circuit and temperature dependent limits is the basis of the protection circuit taught in the Stanley patent previously referenced. The multiplier circuit allows a close match of device capability and protection limits in the thermally limited region, but can be difficult to implement in practice, requiring two pairs of matched transistors to create the multipliers along with surrounding circuitry. Since the output of the multiplier is high impedance, additional active circuitry is needed to apply the RC networks, and bias supplies are needed. The bias supplies are not an additional cost in the case of a grounded output, where this type of circuit has typically been applied. A conventional topology would require referenced bias supplies.

The circuit shown in FIG. 18 behaves such that the average output voltage on R2 is a weighted sum of inputs, rather than the product, which means that the threshold of activation can be matched to that of a multiplier but the approximation becomes increasingly less accurate as the inputs increase or decrease. For example, if at a given point Vce and Ice contributed equally to the voltage on R2, then if each were halved the voltage on R2 would be halved while the true power was reduced to one fourth. This is a large error, but tolerable when concerned mostly with accuracy near the limits and obtaining improved performance over a simple circuit without making the leap to a multiplier topology.

As was the case with FIG. 11, the protection circuit 10 shown in FIG. 18 does not include various circuits, e.g., the preferred four-slope power estimation circuit 12, transistor temperature adjustment circuit 18, or the transistor maximum current limiting circuit 20, that are included in the protection circuit 10 shown in FIG. 9. This is to ensure clarity with regard to the discussion of the thermal equivalent RC network, but should not be interpreted to indicate that these missing circuits could not be included in the circuit shown in FIG. 11.

Figure 15:
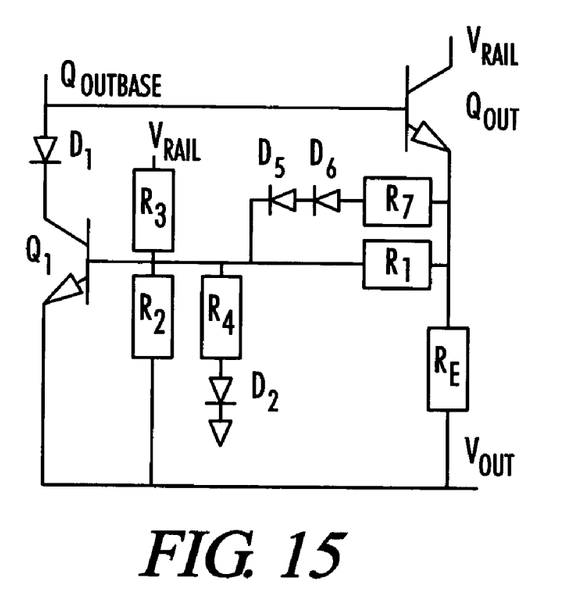
FIG. 15 is a schematic showing one embodiment of a nonlinear override, or maximum current limiting circuit, of the present invention.

Referring back to FIG. 12, the protection threshold of the protection circuit 10 is best matched in the constant power region by setting the Y intercept Ilim2 to exceed the bond wire limitations, shown by the abrupt truncation of the curve. In order to further improve the protection circuit 10, the transistor maximum current limiting circuit 20 (shown in FIG. 9 and also referred to as a nonlinear override circuit 20) is added with a suitable reduced time constant. In one embodiment, this is accomplished using two diodes, D5, and D6, and a resistor R8 as shown in FIG. 15. Again, for clarity, the protection circuit 10 shown in FIG. 15 does not include several of the circuits shown in FIG. 9.

Once the current limiting circuit 20 is added, the effective value of R1 is reduced by paralleling R7 via D5 and D6 when a maximum voltage drop across Re is exceeded. D5 and D6 are simply constant drops and can be replaced by a Zener diode or a different number of diodes.

Although the four-slope curve also exceeds the breakdown voltage limit, no nonlinear override should be necessary. Instead, the power supply rail voltages are chosen such that this limit cannot be exceeded.

As discussed earlier in this application, the SOA of a power transistor is a function of the power transistor's operating temperature. This characteristic is clearly shown in FIG. 2, curves a and b. It follows that the protection circuitry will be the most effective when its limits are set as a function of temperature as well. In one embodiment, the transistor control circuit 16 is simply a transistor, Q1, connected between the power transistor, Qout, and its input signals, and to the output of the power estimate filtering circuit 14. In this case, the first effect to consider is the negative temperature coefficient of Q1's Vbe, which works in the proper direction, tightening limits as Q1's temperature is increased. As a result, the control signals generated by Q1, and the control signals generated by the transistor control circuit 16 in general, vary as a function of temperature.

This can be used most effectively when Q1 is thermally coupled to the power transistor. If they are not coupled, the protection circuit's limits will still be a function of temperature, but it may be ambient temperature that they are tied to.

Figure 16:
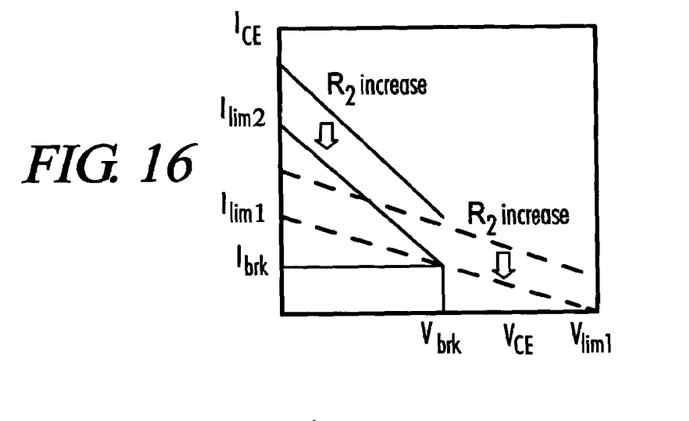
FIG. 16 is a plot showing how the protection threshold generated by the protection circuit of the present invention varies as a function of temperature.

Also, the change in Vbe in Q1 will not likely be significant enough to provide a swing in the protection limits that would be large enough to accurately track Qout's SOA versus temperature. Accordingly, the transistor temperature adjustment circuit 18 (FIG. 9) can be used to enhance the thermal tracking of the limiter if it is configured to track Qout's case temperature. In one embodiment, the temperature adjustment circuit 18 includes a thermistor. The thermistor can either replace R2 or work in series or parallel (as shown in FIG. 9), depending on the type. The effects of changes in R2 due to temperature changes are shown in FIG. 16.

Figure 17:
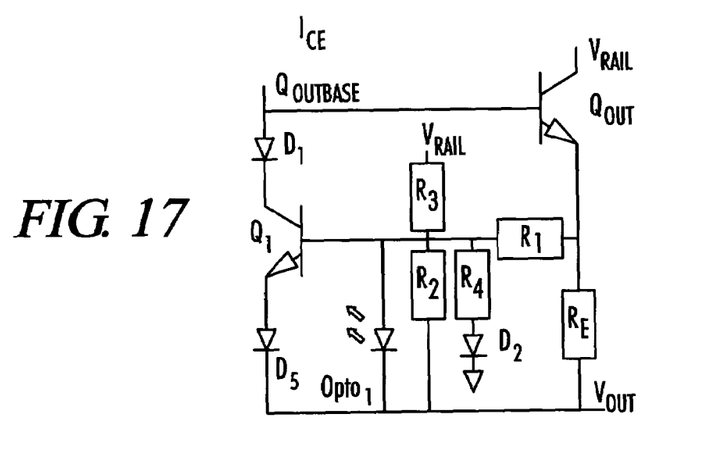
FIG. 17 is a block diagram showing one embodiment of the protection circuit of the present invention that includes a transistor control circuit operable to control both Ice and Vce in response to unsafe power transistor operating conditions.

Referring to FIG. 17, when the protection circuit 10 must take protective action, Q1 is turned on, drawing away drive current from the output device. This action would result in benign clipping into a resistive load. Since a highly reactive load has a more intrusive load line, it is more likely that the protection circuit will be activated under reactive conditions than resistive conditions.

A capacitive load will accept a reduction in drive current by simply slowing down the rate of charge or discharge, causing distortion that may be worse than the resistive case, but still relatively benign.

A highly inductive load, however, will react to an attempted reduction in drive current, negative dI/dt, with a reversal of the voltage across it. In the half-circuit shown in FIG. 17, a positive output current into an inductor, but a negative dI/dt will force the output voltage toward the negative rail, which increases Vce on the output transistor, driving the protection circuit 10 even harder. This regenerative effect causes the output voltage to clamp to the negative rail and create a very audible and well-known distortion mechanism.

Since the protection circuit 10 is concerned with both Vce and Ice, the transistor control circuit 16 can be designed so that it reduces either one in response to an unsafe condition. Reduction of Vce can be achieved by allowing rail voltages to fall, easily achieved in a regulated switching power supply. Since the protection circuit is at the output voltage potential, a level translation circuit is needed. An optocoupler 44 can be used as shown in FIG. 17. The output of the optocoupler 44 (not shown) would be tied to the power supply voltage regulation circuit to reduce output voltage when triggered. Since the reaction time of the voltage reduction is not likely to be fast enough to adequately protect under all conditions, such as short circuit current limiting, the local action of Q1 cannot be removed. An additional diode D5 is added to increase Q1's local protection threshold, which allows the optocoupler to be activated first and Q1 to be activated as a last resort.

Regardless of the type of protection mechanism used, the primary goal should be to avoid output stage failure without affecting normal operation. If a properly designed protection circuit is being activated with normal load, program, and ambient conditions then the problem is not with the protection circuit but with the power stage design, indicating inadequate silicon or heat sinking. If the protection circuit is designed with limits based on the hottest possible operation and is then activated at lower temperatures, then it is not actually protecting the output devices but is causing distortion with no benefit.

Figure 19:
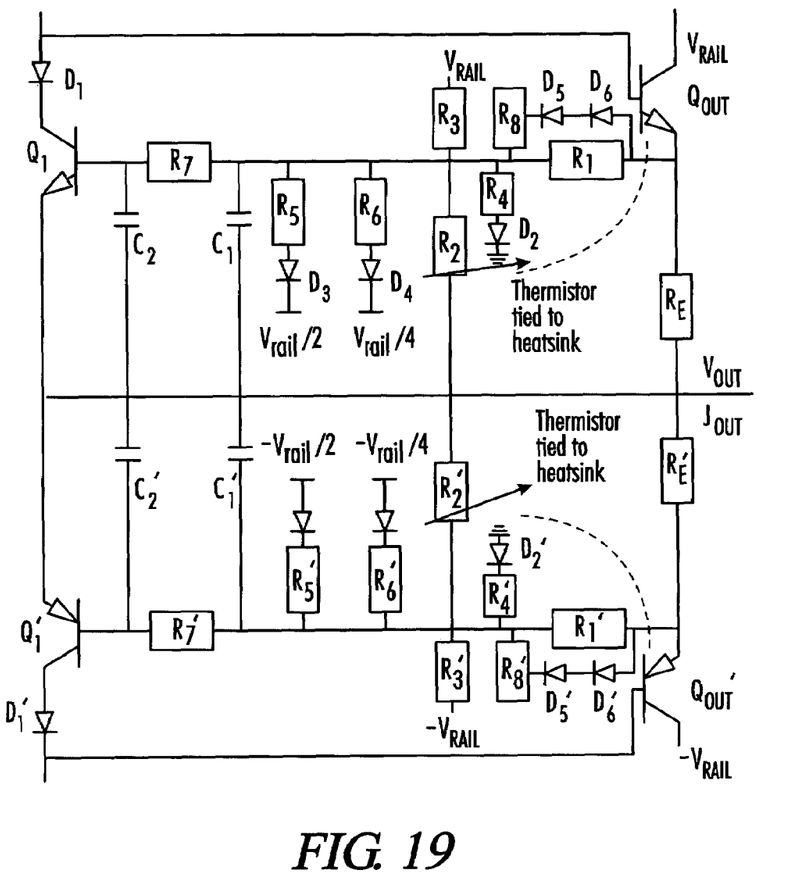
FIG. 19 is a schematic showing two similar versions of the protection circuit of the present invention used with a typical audio amplifier output stage having two power transistors.

For summary purposes, one specific example of how the protection circuit 10 of the present invention might be used is shown in FIG. 19. As shown in that figure, two similar versions of the protection circuit of the present invention, 50 and 60, are used with a typical audio amplifier output stage having two power transistor, Qout and Qout'. Each protection circuit includes a transistor power estimation circuit, a power estimate filtering circuit, a nonlinear override, or current limiting circuit, and a transistor temperature adjustment circuit. One skilled in the art will recognize that Qout is an NPN transistor and Qout' is a PNP transistor. As a result, the protection circuit 60 has slight differences when compared to the protection circuit 50. Absent the variations created by the face that these circuits are designed to operate with two different types of transistors, i.e., NPN versus PNP, the operation and the design procedure associated with each of these circuits is identical.

Thus, although there have been described particular embodiments of the present invention of a new and useful System And Method For Protecting An Audio Amplifier Output Stage Power Transistor, it is not intended that such references be construed as limitations upon the scope of this invention except as set forth in the following claims.

What is claimed is:

1. A protection circuit, comprising:
   a transistor power estimation circuit;
   a power estimate filtering circuit connected to the transistor power estimating circuit;
   a transistor control circuit connected to the power estimate filtering circuit;
   a transistor temperature adjustment circuit connected to the transistor power estimating circuit; and
   a transistor maximum current limiting circuit connected to the transistor power estimating circuit.

2. The circuit of claim 1, wherein the transistor power estimation circuit includes:
   a transistor current sensing circuit;
   a transistor voltage sensing circuit; and
   a summing circuit connected to the transistor current and voltage sensing circuits.

3. The circuit of claim 1, wherein the transistor power estimation circuit is a single slope power estimation circuit.

4. The circuit of claim 1, wherein the transistor power estimation circuit is a two-slope power estimation circuit.

5. The circuit of claim 1, wherein the transistor power estimation circuit is a four-slope power estimation circuit connected to a reference voltage that falls between ground and a main power transistor rail voltage.

6. The circuit of claim 1, wherein the transistor power estimation circuit is a multi-slope power estimation circuit that includes a resistor diode network connected to a reference voltage that falls between ground and a main power transistor rail voltage.

7. The circuit of claim 1, wherein the power estimate filtering circuit includes an averaging circuit.

8. The circuit of claim 1, wherein the power estimate filtering circuit includes a transistor thermal equivalent circuit.

9. The circuit of claim 1, wherein the power estimate filtering circuit includes a resister capacitor network.

10. The circuit of claim 1, wherein the transistor maximum current limiting circuit includes a predetermined number of diodes and a resistor.

11. The circuit of claim 1, wherein the transistor control circuit includes a transistor.

12. The circuit of claim 1, wherein the transistor temperature adjustment circuit includes a thermistor thermally coupled to a case of a power transistor.

13. The circuit of claim 1, wherein the transistor temperature adjustment circuit is integrated into the transistor power estimation circuit.

14. The circuit of claim 1, wherein the transistor control circuit includes an optocoupler coupled to a power supply regulation circuit in a manner that causes a power supply voltage applied to a power transistor to be reduced when the optocoupler is triggered.

15. The protection circuit of claim 1, wherein the transistor temperature adjustment circuit is adapted to cause the transistor power estimation circuit to generate a power estimate that varies as a function of a temperature associated with a power transistor.

16. The protection circuit of claim 1, wherein the transistor temperature adjustment circuit adapted to cause the transistor control circuit to generate a control signal that varies as a function of a temperature associated with a power transistor.

17. A protection method, comprising the steps of:
   generating a power estimate of power dissipated by a power transistor;
   filtering the power estimate to eliminate any transient power estimates and to generate a filtered power estimate; and
   comparing the filtered power estimate to a predetermined power limit and, when the filtered power estimate exceeds the predetermined power limit, generating a power transistor control signal that causes the power transistor to reduce its power dissipation.

18. The method of claim 17, further comprising the steps of adjusting the filtered power estimate so that it varies as a function of power transistor operating temperature.

19. The method of claim 17, further comprising the stops of limiting current output by the power transistor to a predetermined maximum level.

20. The method of claim 17, wherein the power transistor control signal causes the power transistor to reduce its power dissipation by reducing power supply voltage applied to the power transistor.

21. The method of claim 17, wherein the power transistor control signal causes the power transistor to reduce its power dissipation by reducing base current flowing into the power transistor.

22. The method of claim 17, wherein the power transistor control signal causes the power transistor to reduce its power dissipation by reducing power supply voltage applied to the power transistor and reducing base current flowing into the power transistor.

23. A method of estimating junction temperature of a transistor, comprising the steps of:
   generating a piecewise linear approximation of the transistor's power dissipation;
   varying the piecewise linear approximation as a function of transistor temperature; and
   averaging the temperature varying, piecewise linear approximation to generate an estimate of transistor junction temperature.

* * * * *